United States Patent
Korec et al.

(10) Patent No.: US 8,722,503 B2
(45) Date of Patent: May 13, 2014

(54) CAPACITORS AND METHODS OF FORMING

(75) Inventors: Jacek Korec, Sunrise, FL (US);
Shuming Xu, Schnecksville, PA (US);
Jun Wang, Bethlehem, PA (US); Boyi Yang, Melbourne, FL (US)

(73) Assignee: Texas Instruments Incorporated, Dallas, TX (US)

( * ) Notice: Subject to any disclaimer, the term of this patent is extended or adjusted under 35 U.S.C. 154(b) by 224 days.

(21) Appl. No.: 13/184,854

(22) Filed: Jul. 18, 2011

(65) Prior Publication Data

US 2012/0012982 A1    Jan. 19, 2012

Related U.S. Application Data

(60) Provisional application No. 61/365,154, filed on Jul. 16, 2010.

(51) Int. Cl.
*H01L 21/20* (2006.01)

(52) U.S. Cl.
USPC .......................................... 438/382; 438/386

(58) Field of Classification Search
USPC .................. 257/301, 532, E27.025, E21.008, 257/E21.396; 438/382, 386
See application file for complete search history.

(56) References Cited

U.S. PATENT DOCUMENTS

| | | | |
|---|---|---|---|
| 5,759,903 A * | 6/1998 | Lehmann et al. | 438/386 |
| 7,067,869 B2 | 6/2006 | Cheng et al. | |
| 7,902,033 B2 | 3/2011 | Williams et al. | |
| 2003/0183866 A1* | 10/2003 | Sanchez et al. | 257/312 |
| 2004/0099898 A1* | 5/2004 | Grivna et al. | 257/309 |
| 2007/0158725 A1* | 7/2007 | Cheng et al. | 257/301 |
| 2007/0194407 A1* | 8/2007 | Nakayama et al. | 257/532 |
| 2008/0185680 A1* | 8/2008 | Cheng et al. | 257/532 |
| 2010/0032801 A1* | 2/2010 | Jacobs et al. | 257/532 |

* cited by examiner

*Primary Examiner* — Matthew Reames
*Assistant Examiner* — Farid Khan
(74) *Attorney, Agent, or Firm* — Warren L. Franz; Wade J. Brady, III; Frederick J. Telecky, Jr.

(57) ABSTRACT

Capacitors and methods of forming semiconductor device capacitors are disclosed. Trenches are formed to define a capacitor bottom plate in a doped upper region of a semiconductor substrate, a dielectric layer is formed conformally over the substrate within the trenches, and a polysilicon layer is formed over the dielectric layer to define a capacitor top plate. A guard ring region of opposite conductivity and peripheral recessed areas may be added to avoid electric field crowding. A central substrate of lower doping concentration may be provided to provide a resistor in series below the capacitor bottom plate. A series resistor may also be provided in a resistivity region of the polysilicon layer laterally extending from the trenched area region. Contact for the capacitor bottom plate may be made through a contact layer formed on a bottom of the substrate. A top contact may be formed laterally spaced from the trenched area by patterning laterally extended portions of one or more of the dielectric, polysilicon and top metal contact layers.

5 Claims, 8 Drawing Sheets

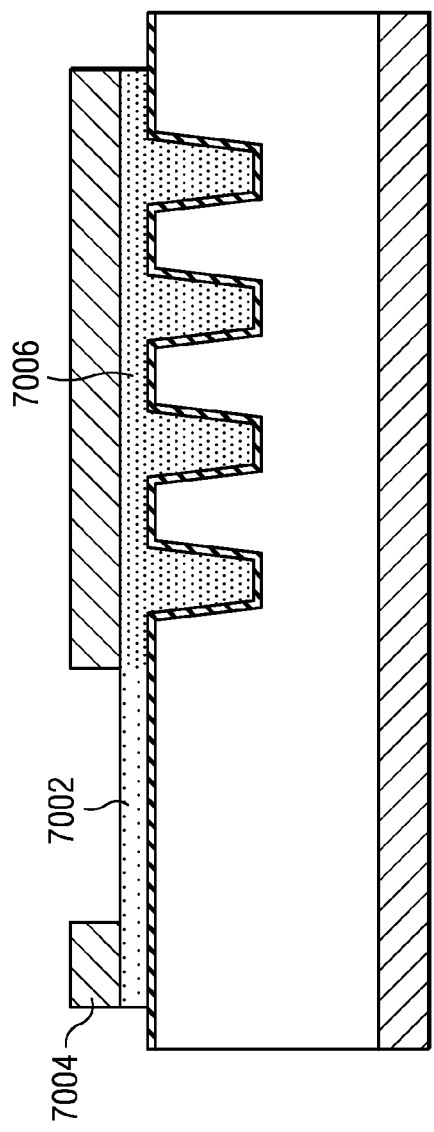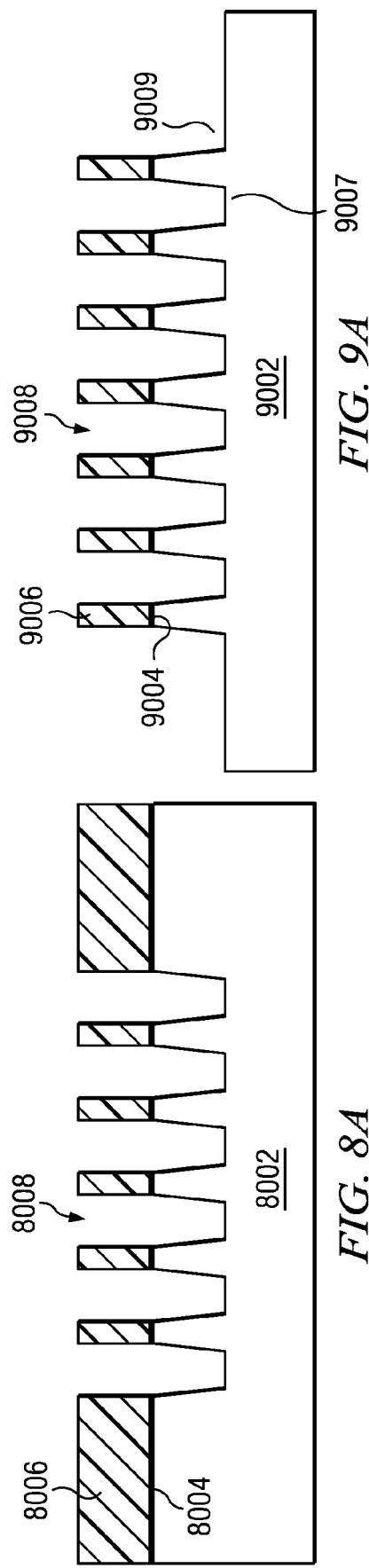

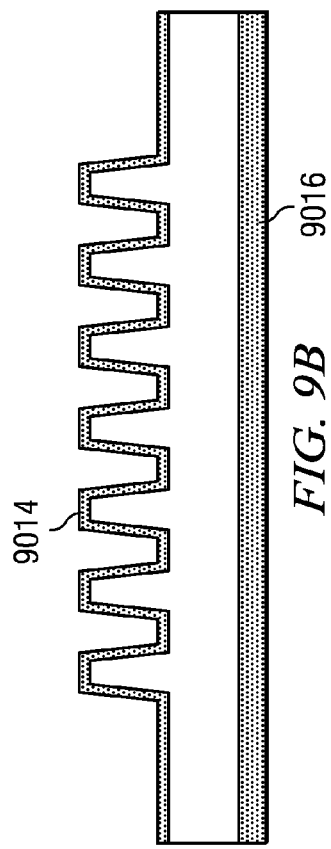
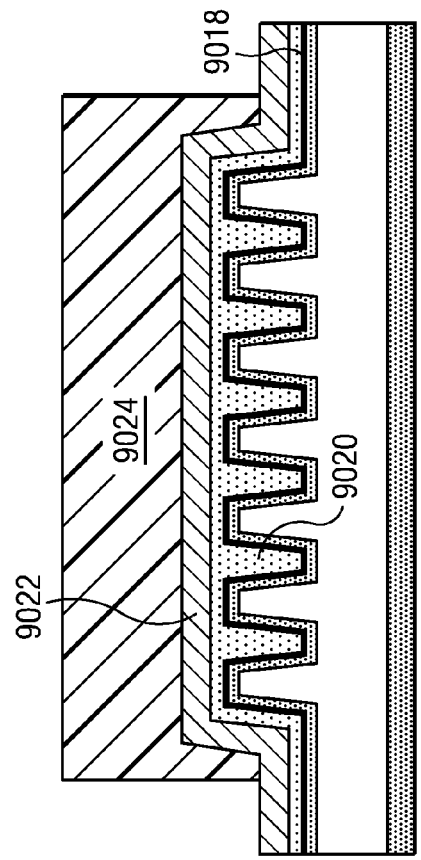
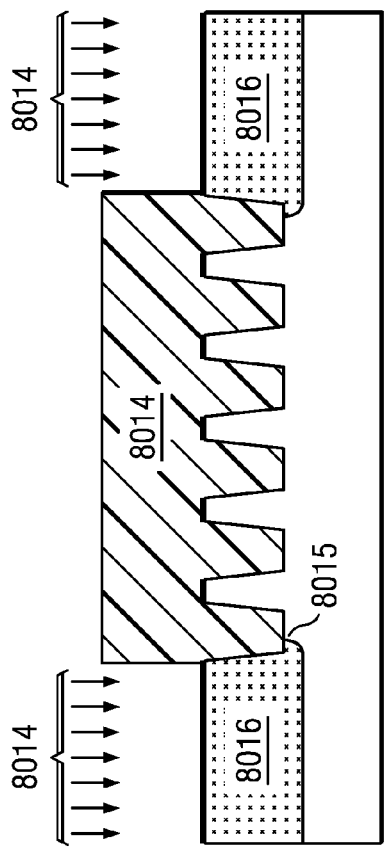
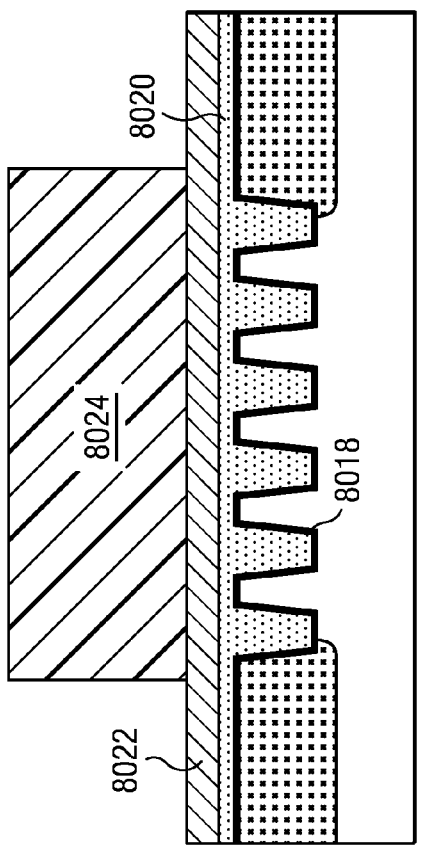

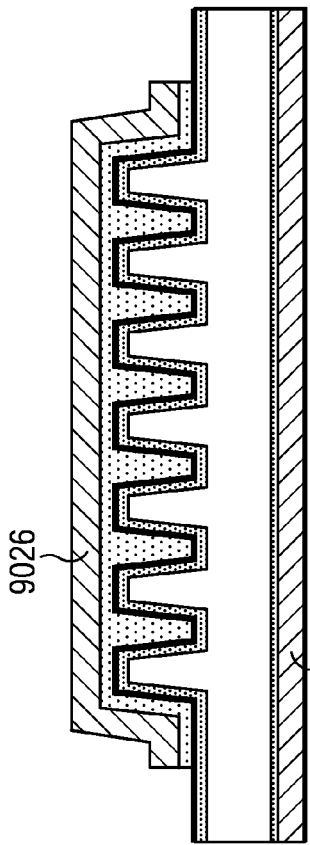
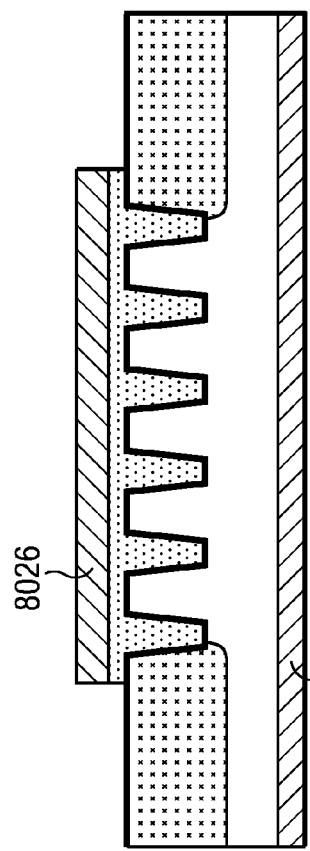
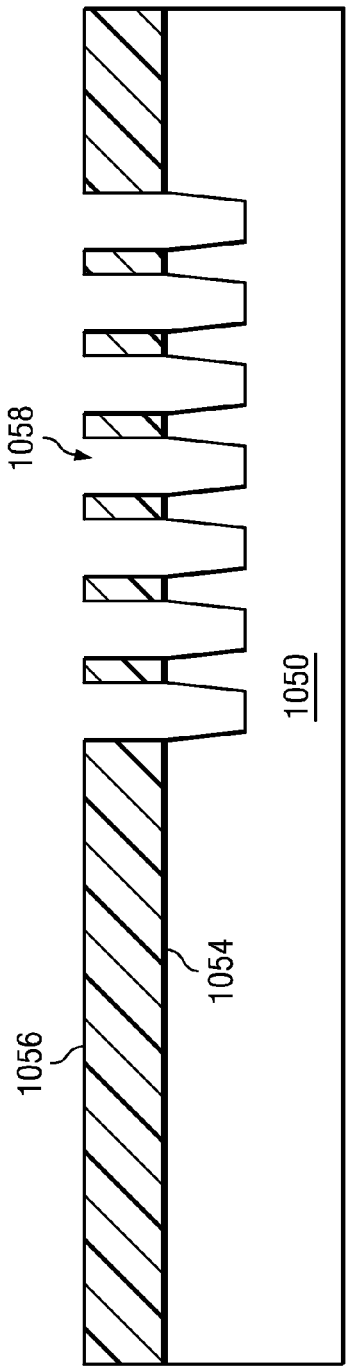

CAPACITORS AND METHODS OF FORMING

This application claims the benefit of provisional Application No. 61/365,154 filed Jul. 16, 2010, the entirety of which is incorporated herein by reference.

BACKGROUND

This relates to semiconductor devices, such as integrated circuits and the like and their manufacture, including capacitors suitable for the high power operation, as well as to integration of such capacitors in series with resistors.

High performance integrated power modules require improved power distribution and decoupling as compared with conventional circuit devices. Inductive and capacitive parasitic losses present in conventional single chip packaging and surface mount technology dictate that many new high performance circuit designs be implemented using multi-chip module packaging technologies.

Multi-chip module packages enable more integrated circuits to be packed into a given area. In addition to reducing size, such technology permits increased speed because interconnect distances are shorter. High switching speeds, high bandwidth and high dynamic range of these circuits require that the power/ground distribution systems provide very low impedance decoupling with low noise and ripple.

In power modules where substantial current switching occurs, the decoupling performance is directly affected by the series inductance between capacitor elements and the power and ground planes. Voltage spikes caused by $L*di/dt$ effects may result in severe electric stress of the integrated components and are a main source of electromagnetic interference (EMI) noise.

Existing low profile, low equivalent series inductance (ESL) surface mount capacitors typically require about four patterning levels to manufacture and are expensive. Capacitors fabricated with emerging silicon technologies using high-k dielectrics are typically limited to voltages less than about 10 volts.

A need exists for improvements in capacitors and their fabrication such as for improved low inductance, low cost, low profile, surface mount capacitors for use in integrated power multi-chip module packages. Example applications may include RC snubber and decoupling capacitors in a synchronous buck converter.

SUMMARY

The disclosure relates to methods of forming capacitors and the capacitors formed thereby.

In example embodiments, described for purposes of illustration, trenches are formed to define a capacitor bottom plate in a doped upper region of a semiconductor substrate, a dielectric layer is formed conformally over the substrate within the trenches, and a polysilicon layer is formed over the dielectric layer to define a capacitor top plate. Few masking steps are needed.

Another masking step may be used to provide a guard ring region of opposite conductivity type to the trenched region in the substrate. Alternatively, or in addition, outer trenches may be widened to provide a recessed area to avoid electric field crowding at end trench corners.

The doping concentration of the substrate in the trenched area may be varied to provide upper and lower regions of higher doping, and a central region of lower doping for providing a resistor in series with the capacitor. The upper region may be formed to follow the contour of the trenches. Alternatively, or in addition, a series resistor may also be provided in a resistor portion of the polysilicon layer extending laterally between a trench area portion and a contact area portion. A hardmask segment may be formed over the resistor portion to prevent etching during patterning of the capacitor top plate and contact. Doping may also be made higher in the trench area and contact portions than in the resistor portion.

Contact for the capacitor bottom plate may be made through a contact layer formed on a bottom of the substrate, with or without an intervening series resistor. Alternatively, or in addition, a top contact may be formed laterally spaced from the trenched area by patterning laterally extended portions of one or more of the dielectric, polysilicon and top metal contact layers.

Those skilled in the art will appreciate that general features of the described aspects are not mutually exclusive and may be applied together in various combinations in a single structure.

BRIEF DESCRIPTION OF THE DRAWINGS

Example embodiments are described with reference to accompanying drawings, wherein:

FIG. 7 is a cross-sectional view showing example characteristics of a lateral resistor that may be included, either separately or together in combination with the substrate resistor, in series with the capacitor.

FIGS. 8A-8D are views illustrating steps in the fabrication of a capacitor having the general features of the capacitor of FIG. 1, including characteristics for reducing electric field crowding such as shown in FIG. 3.

FIGS. 9A-9D are views illustrating steps in the fabrication of a capacitor, including field crowding reduction characteristics such as shown in FIG. 2 and substrate resistor characteristics such as shown in FIG. 6.

FIGS. 10A-10E are views illustrating steps that can be integrated in the fabrication of the capacitor for including a contact such as shown in FIG. 4.

DETAILED DESCRIPTION OF EXAMPLE EMBODIMENTS

Figure 1:
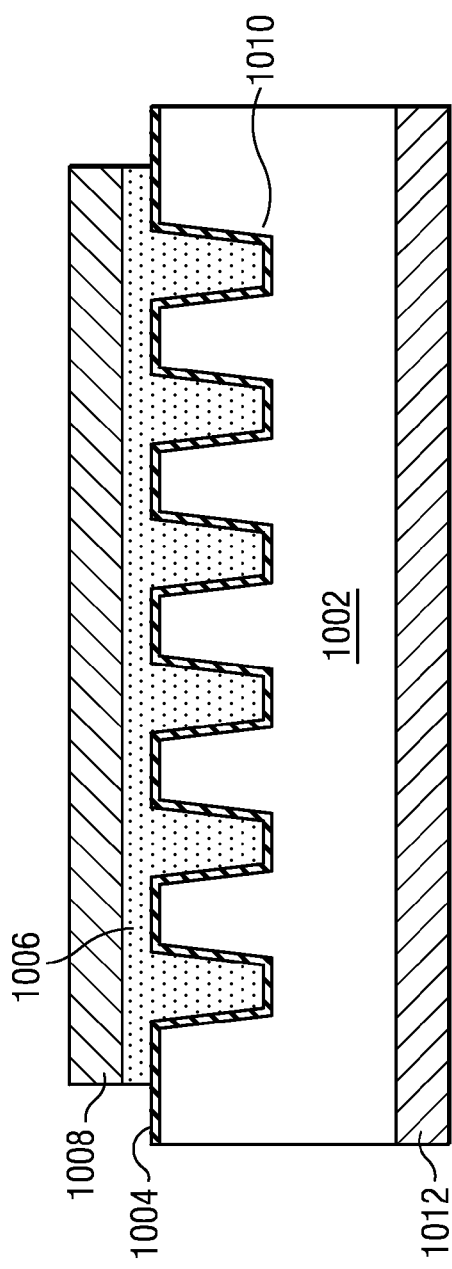
FIG. 1 is a cross-sectional view showing general features of a capacitor formed according to principles of the invention.

General features of a capacitor implemented in accordance with an example embodiment of principles of the invention are shown in FIG. 1. The illustrated features are suitable, for example, in implementation of a low cost, low equivalent series inductance (ESL) capacitor suitable for high power application in a multi-chip power module.

The capacitor may be built on a silicon substrate 1002. Trenches may be formed in the substrate to increase the effective capacitor area between a top capacitor plate 1006 and a bottom capacitor plate 1002. A capacitor dielectric 1004 may have a thickness chosen to support the required capacitance voltage. The silicon substrate may be heavily doped to greater than about $10^{18}$ atoms/cm$^3$. The capacitor area may range from about 1 to 5 mm$^2$. Trench width and space may range from about 0.25 µm width and 0.25 µm space to 0.5 µm width and 0.7 µm space. The trench width and trench space need not be equal. Trench depth may range from about 0.5 µm deep to over 5 µm deep. The top capacitor plate may be a metal 1008 such as aluminum or copper on top of a doped polysilicon or polycide (polysilicon and silicide stack) 1006 layer. In an example embodiment capacitor that supports 20 volts, the substrate is silicon doped with n-type dopant to a concentration of about $10^{19}$ atoms/cm$^3$, the trench width is about 0.3 µm, the trench spacing is about 0.5 µm, the trench depth is about 3.0 p, m, the capacitor dielectric is about 40 nm thick oxide (e.g., thermally grown silicon oxide), the top plate is 0.5 µm in situ doped polysilicon with overlying 1008 layer of aluminum about 0.3 µm thick. The capacitor height is about 300 µm. The backside metallization 1012 is a TiNiAg solderable contact that is well known in the semiconductor industry (e.g., Si: 0.2 µm Ti: 0.2 µm Ni: 0.6 µm Ag).

Electric field crowding may occur at the bottom corner of the last trench 1010 in the capacitor shown in FIG. 1. Electric field crowding may result in a lower breakdown voltage at the trench bottom corner. One method to fix this problem is to increase the thickness of the capacitor dielectric 1004 so the breakdown voltage at the bottom corner of the last trench meets specification. Increasing the dielectric thickness to increase the breakdown voltage at the bottom corner of the trench may reduce the capacitance and may require a larger area capacitor to meet capacitance specification, thus increasing cost.

Figure 2:
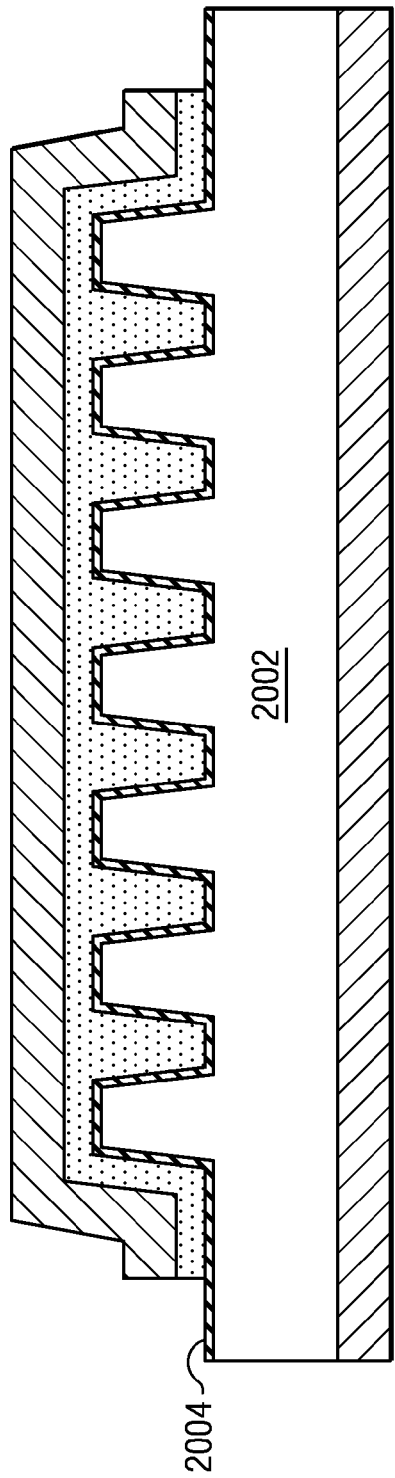
FIGS. 2 and 3 are cross-sectional views showing example characteristics that may be included separately or together in combination for reducing electric field crowding in capacitors having the features shown in FIG. 1.

FIG. 2 shows a modification of the capacitor of FIG. 1 to change the capacitor edge termination 2004 by overlapping the top plate 2004 beyond the last outer corner 2002, thus reducing electric field crowding.

Figure 3:
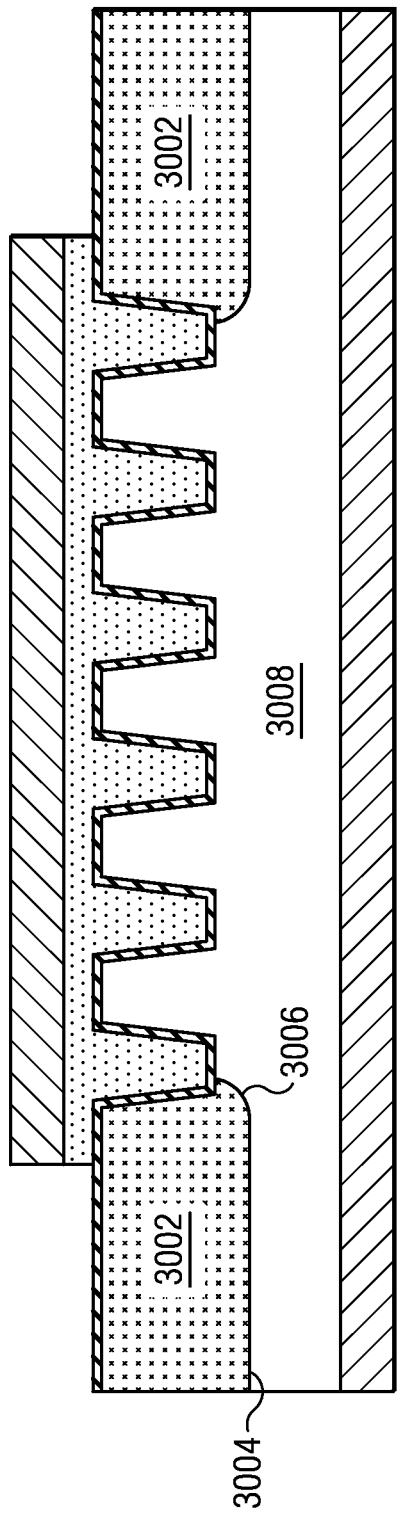

FIG. 3 shows another modification of the capacitor of FIG. 1 to address the electric field crowding issue at the bottom corner of the last trench. Here, a guard ring region 3002 of doping opposite to the substrate doping is added around the outside perimeter of the capacitor and next to the bottom corner of the last trench. This adds one photoresist pattern to the capacitor manufacturing flow. During sawing of the capacitors, the outer edges 3004 of the capacitor are damaged, enabling a leakage current to flow through the damaged area bringing the guard ring potential to the same potential as the capacitor bottom plate 3008.

Figure 4:
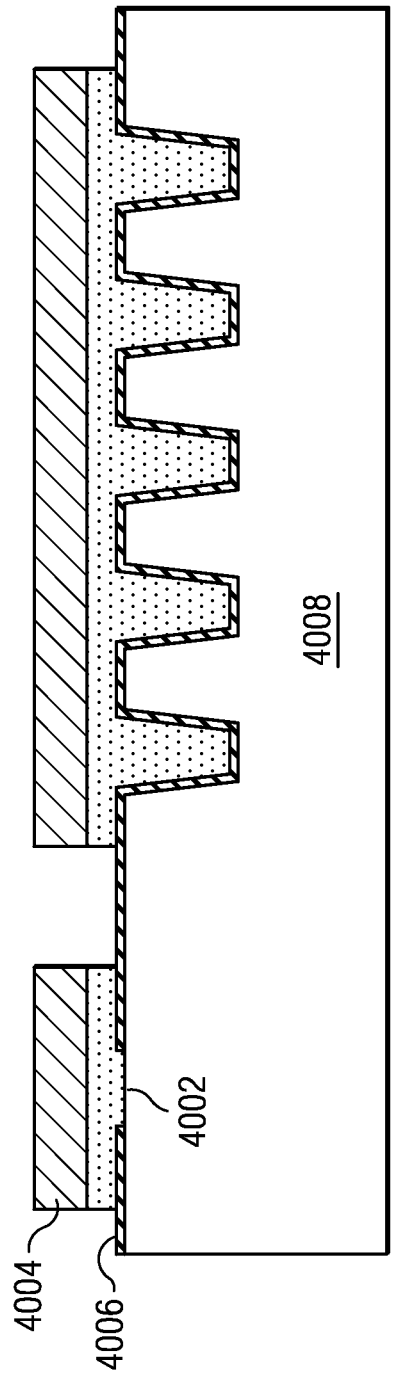
FIG. 4 is a cross-sectional view showing an example of a contact that may be included.

As shown in FIG. 4, a top side contact 4004 may be added for electrical contact to the capacitor bottom plate 4008. This adds one photomask step to the manufacturing flow to form a top side contact opening 4002 through the capacitor dielectric 4006.

Figure 5:
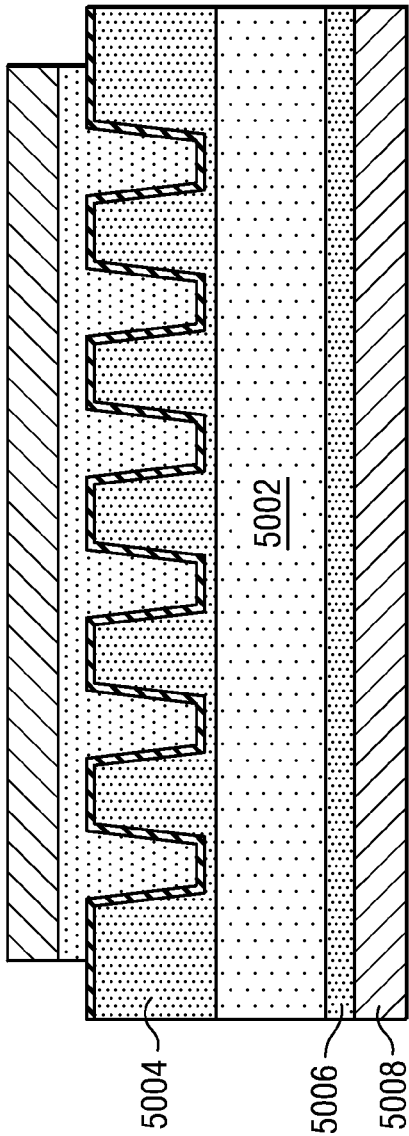
FIGS. 5 and 6 are cross-sectional views showing example characteristics of a substrate resistor that may be included in series with the capacitor.

The addition of a resistor in series with the capacitor is shown in FIG. 5. A low doped, high resistance 5002 substrate region is formed in the substrate below the trenches, sandwiched between an overlying highly doped region 5004 in which the capacitor bottom plate is formed and an underlying highly doped region 5006 which forms good electrical contact to a bottom metal layer 5008. The low doped layer 5002 may have doping lower than about $10^{16}$ atoms/cm$^3$ and the highly doped layers 5006 and 5004 may have doping higher than about $10^{18}$ atoms/cm$^3$.

Figure 6:
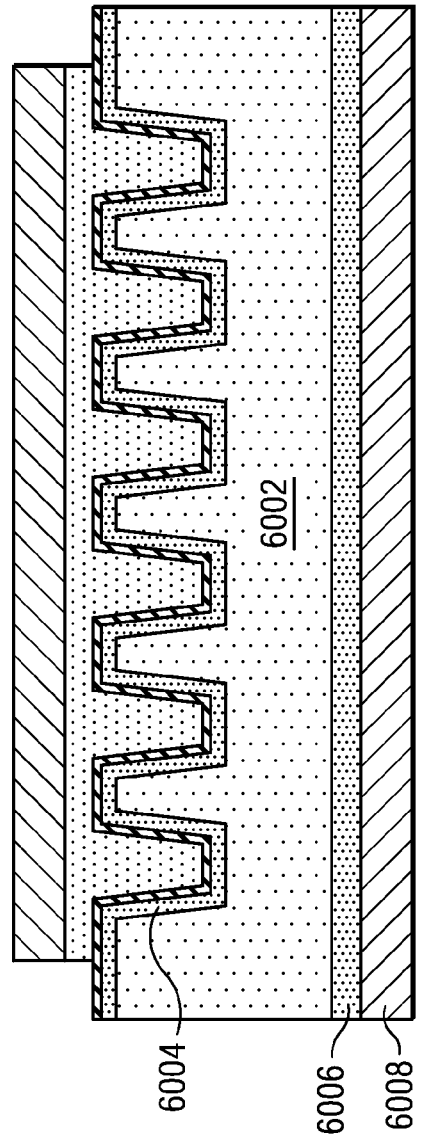

FIG. 6 shows a variation of the integrated capacitor and series resistance structure of FIG. 5. After the trenches are formed, highly doped regions for the bottom capacitor plate 6004 and for the bottom electrical contact 6006 may be formed by diffusing dopant into the surface of the substrate, leaving a low doped, high resistance region 6002 between the highly doped regions. Here, the highly doped region 6004 substrate is a surface doped region that follows the contour of the trenches, and highly doped region 6006 is a generally horizontally extending deep buried layer spaced from the bottom of the trenches. POCl$_3$ doping by diffusion in a furnace may be used or doping from a solid source or a doped spin on glass that is later removed may be used. The low doped substrate may have a doping of $10^{16}$ atoms/cm$^3$ or less and the highly doped regions may be doped to $10^{18}$ atoms/cm$^3$ or more.

FIG. 7 illustrates a series resistor 7002 of top plate polysilicon formed between the top side contact 7004 and the capacitor top plate 7006. This adds one mask step since the polysilicon top plate 7002 and resistor 7006 are etched separately from the top side contact 7004.

Steps for forming a capacitor having a configuration like that shown in FIG. 3 are described with reference to FIGS. 8A-8D.

In FIG. 8A, a pad oxide layer 8004 is grown or deposited over a top surface of a semiconductor (e.g., silicon) substrate 8002. The substrate may be doped with p-type or n-type dopant. A highly doped n-type substrate is advantageous to minimize equivalent series resistance (ESR). A photoresist or other masking material mask layer 8006 is formed on the pad oxide layer 8004 and patterned with a trench opening pattern. A plasma etch is then used to etch the pad oxide 8004 and substrate 8002 through the mask pattern to form trenches 8008 into the substrate 8002 with openings in the pad oxide 8002.

In FIG. 8B, another mask layer 8012 formed over the trenches and pad oxide in the capacitor area and patterned to define an optional guard ring implantation pattern. A dopant 8014 of opposite conductivity type to that of the background conductivity of the substrate 8002 is implanted into the substrate through the patterned mask layer 8012 to form a guard ring region 8016 around the perimeter of the capacitor, adjacent to the outer trenches. This guard ring serves to reduce electric field crowding at the bottom corner 8015 of the outer most trench in the capacitor. A subsequent anneal with temperature greater than about 900° C. may be used to drive in and activate the implanted dopant 8014.

In FIG. 8C, the pad oxide layer 8004 is stripped and a thin layer of capacitor dielectric material 8018 is formed by blanket deposition over the substrate, including conformally following the contour within the trenches. The capacitor dielectric material 8018 may, for example, be a thermally grown oxide (e.g., silicon oxide), a deposited oxide, a deposited nitride, a deposited oxynitride, or a high-k dielectric such as hafnium oxide or tantalum oxide. The thickness of the dielectric is chosen as appropriate to accommodate the required operating voltage of the capacitor. Prior to forming the capacitor dielectric 8018, the top and bottom corners of the capacitor trenches may be rounded to reduce electric field crowding. The corner rounding may be accomplished by growing and stripping an oxide layer by performing a hydrogen anneal prior to growing or depositing the capacitor dielectric 8018. A polysilicon top plate layer 8020 is then deposited over the dielectric layer 8018 to overfill the trenches to a generally horizontally planar level extending laterally for at least a short distance beyond the outer trenches over the top surface of the substrate. The layer 8020 may conveniently be doped in situ (i.e., during deposition). A metal cap layer 8022, which may comprise a metal such as aluminum, aluminum alloy, TiW, or copper, is then blanket deposited to a generally level thickness over the top of the polysilicon layer 8020, and another mask layer 8024 is formed and patterned with a capacitor top plate pattern over the metal cap layer. Unmasked portions of the metal cap layer 8022 and underlying polysilicon layer 8020 outside the area of the capacitor are then etched away, leaving masked portions in and over the trenches remaining to define a capacitor top plate. Alternatively, the top plate may be formed by depositing a barrier layer such as TiN or TaN directly on the capacitor dielectric 8018, and filling the trenches with a metal such as W deposited by chemical vapor deposition (CVD).

FIG. 8D shows the capacitor after the capacitor top plate 8026 has been formed and after blanket deposition of a backside metal layer 8028 over a bottom side surface of the substrate. An anneal in forming gas or an inert gas may be performed in a temperature range of about 350 C. to 450 C. to ensure good contact resistance.

The resulting capacitor has a configuration like that of the capacitor shown in FIG. 3, and may be formed using three photolithography mask patterning steps as described—one for patterning each of masks 8006, 8012 and 8024. If the guard ring region 8012 is omitted, the structure can be formed using just two photolithography mask steps.

A resistor like that shown in FIG. 5 or 6 may be added in series with the capacitor during fabrication by providing appropriately differently doped regions at different elevation levels within the substrate.

Steps for forming a capacitor having a configuration like that shown in FIG. 2 and including a series resistor like that shown in FIG. 6 are described with reference to FIGS. 9A-9D.

FIG. 9A shows a pad oxide layer 9004, similar to pad oxide layer 8004, grown or deposited over a top surface of a semiconductor substrate 9002 which may also be doped. As previously described, a photoresist or other mask layer 9006 is formed on the pad oxide layer 9004 and patterned with a trench opening pattern, and the pad oxide 9004 and substrate 9002 are etched through the mask pattern to form trenches 9008 into the substrate with openings in the pad oxide 9004. In contrast to mask layer 8006 however, mask layer 9006 is patterned to leave areas peripheral to the capacitor trench area uncovered, so that portions of the substrate peripheral to the outer trenches are also etched. This results in a recessed area (to approx. trench depth and spaced by a trench spacing from the other trenches) that serves to reduce electric field crowding at the bottom corners of the outermost trenches 9007. The recessed area may conveniently be formed by providing a greater width of outer trenches in a peripheral part of the trenched area, the remaining trenches being generally uniformly dimensioned and spaced.

In FIG. 9B, the pad oxide 9004 has been removed, and top surface and bottom surface regions 9014, 9016 have been implanted with dopant of the same conductivity to increase their doping concentration, leaving a central region of lower doping concentration and higher resistivity (ESR) to provide a series resistor. As with region 6004 of the resistor configuration shown in series with the capacitor of FIG. 6, the heavily doped top surface region 9014 shown in FIG. 9B is relatively thin (viz., thickness less the height of the trenches) and follows the contours of the trenches. The heavy doping provides increased capacitance for the bottom capacitor plate. The heavily doped bottom surface region 9016 (which can be achieved through implantation from the bottom or deep implantation from the top) is akin to the region 6006 of FIG. 6. It has a thickness chosen based on targeted resistor characteristics (e.g., vertical thickness and doping of the central region between the heavily doped regions) and provides good electrical contact for electrical connection to the substrate bottom surface. If the substrate doping is of n-type conductivity, the doping may, for example, include using a POCl3 furnace anneal. If a series resistor is not needed for any capacitor or in a particular capacitor area (as, for example, where multiple capacitors are formed on a single chip—some with, and some without, a series resistor) the described additional doping step may be omitted completely or for selected areas (such as by masking off that area). Alternatively, the entire substrate (including the central region) may be given a higher doping concentration. (It will be appreciated that the resistor formation doping step or steps can also be readily modified and implemented to provide one or more series resistors having the configuration shown in FIG. 5. It will also be appreciated that by adding similar steps, the implementation of a series resistor can also readily be added in the process described above with reference to FIGS. 8A-8D.)

In FIG. 9C, after removal of the pad oxide layer 9004 and formation of the series resistor regions, if done, a thin layer of capacitor dielectric material 9018 is formed over the substrate, including following the contour within the trenches. The dielectric material and manner of formation may be the same as described for the formation of dielectric layer 8018. A polysilicon top plate layer 9020 may then be deposited over the dielectric layer 8018, over and filling the trenches similar to the described deposition of layer 8020. Instead of extending laterally for a thickness above a level of the tops of the trenches, however, layer 9020 will extend for at least a short distance beyond the outer trenches over the peripheral recessed region, for a thickness (shown less than the height of the trenches) above the level of the bottoms of the trenches. As with layer 8020, the doping of layer 9020 may be accomplished in situ, during the deposition process. A metal cap 9022 similar to metal cap layer 8022 is then deposited over the polysilicon layer 9020 which may be of the same metal as metal cap layer 8022. A mask layer 9024 is then formed over the metal cap layer 9022, and patterned for etching the layers 9022, 9020 to remove portions laterally beyond the area of the capacitor, thereby defining the contours of the capacitor top plate 9026.

FIG. 9D shows the capacitor after etching layers 9022, 9020 to define the top plate 9026, removing the patterned mask layer 9024, and metal deposition to form a backside metal layer 9028 over the substrate bottom surface. In contrast to the capacitor shown in FIG. 8D, the lateral edges of the plate 9026 slope downward to the top surface of the substrate peripheral to the capacitor area, at a level of the bottoms of the trenches. The capacitor may then be sintered in forming gas at about 350 C. to 450 C. to form good electrical contact between the top plate metal 9022 and the top plate polysilicon 9018 and also between the backside metal 9028 and the substrate 9002. The resulting capacitor is thus formed using only two masking patterns and has a configuration like that shown in FIG. 2.

Steps for forming contacts for the top and bottom plates of the described capacitors are illustrated in FIGS. 10A-10E. Although described by way of example in connection with the formation of a capacitor having a configuration like that of FIG. 3, using steps such as described above in reference to FIGS. 8A-8D, it will be appreciated that similar considerations can be employed to establish contacts for a capacitor having a configuration like that of FIG. 2. It will further be appreciated that the described contact forming steps can be readily integrated with previously described steps for the formation of capacitors including guard ring regions, peripheral substrate level lowering, and substrate doping to provide series resistors, without the need to repeat such steps in all the various combinations here.

The right side of FIG. 10A shows a plurality of trenches formed in a substrate 1050 with openings onto an overlying pad oxide layer 1054 by etching through a patterned mask layer 1056. The trenches may have the same configuration and be formed in the same manner described for the trenches shown in FIG. 8A. The left side of FIG. 10A shows parts of the substrate and pad oxide outside the trenched region that are shielded from etching by unbroken parts of the mask layer.

Figure 10B:
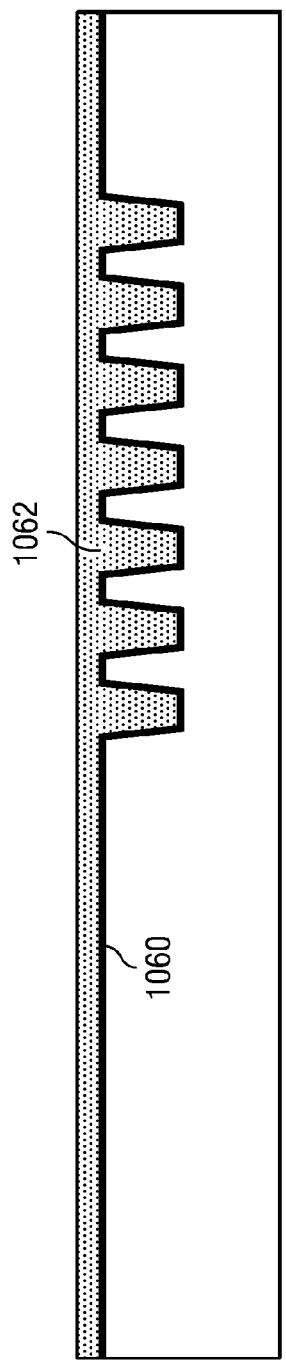

FIG. 10B shows the structure of FIG. 10A after removal of patterned mask layer 1056 and pad oxide layer 1054, and formation of a capacitor dielectric layer 1060 and a doped polysilicon top plate layer 1062 in the same manner as described above for formation of layers 8018 and 8020 shown in FIG. 8C. Capacitor dielectric layer 1060 may, for example, be a thermally grown oxide, a deposited oxide or nitride, or a high-k dielectric, with a thickness (viz., less than the depth of the trenches) chosen to accommodate the required capacitor voltage capability. The polysilicon layer 1062 may be deposited silicon, with doping added during deposition. Layer 1062 is deposited to a level that fills (viz., overfills) the trenches and optionally planarized, e.g., using chemical-mechanical polishing (CMP), to achieve a desired thickness with a generally planar top surface over untrenched parts of the substrate. The layers 1060, 1062 extend laterally beyond the trenched area.

Figure 10C:
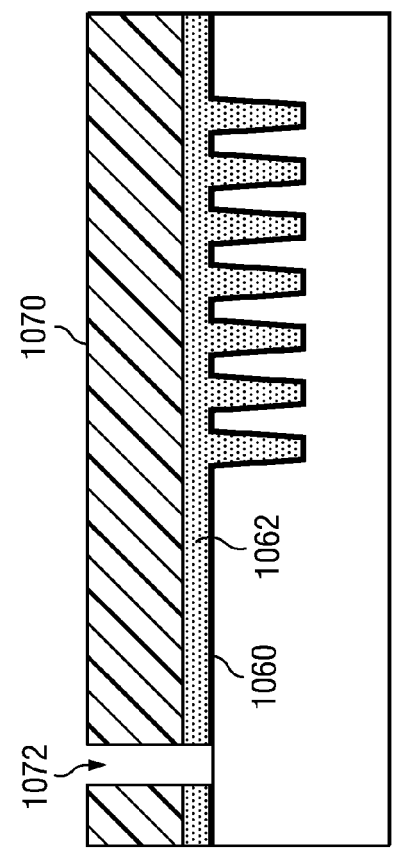

FIG. 10C shows a contact opening 1072 formed by etching the polysilicon layer 1062 and underlying dielectric layer 1060 through a patterned mask layer 1070 formed over the polysilicon layer 1062, in the portions of the layers 1060, 1062 extending beyond the trenched area. Optionally, the contact opening may be formed by forming the contact pattern directly on the capacitor dielectric, but some dielectrics may be degraded by transferring the mask pattern to them directly.

Figure 10D:
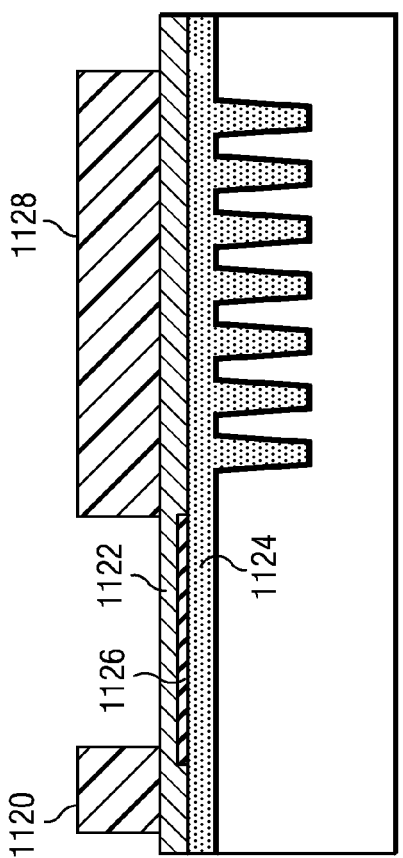

In FIG. 10D, a metal cap layer 1082 is deposited over the polysilicon layer 1062 in the same manner as described for the deposition of metal cap layer 8022 in reference to FIG. 8C. The metal cap layer covers the portion of the polysilicon layer 1062 over the trenched region of the substrate, and fills the contact opening 1072. Another mask layer 1080 is then formed over the metal cap layer 1082 and patterned to define the capacitor top plate and also a top side contact.

Figure 10E:
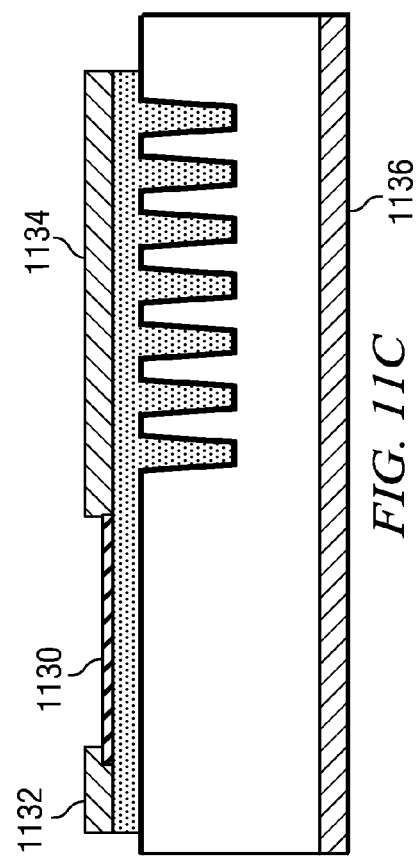

FIG. 10E shows the resulting structure after etching the metal cap layer 1082 and underlying polysilicon layer 1062 through the patterned mask layer 1080, and subsequent removal of the patterned mask layer 1080. The etching forms a capacitor top plate 1092 (a metal contact defined by etched layer 1082 in electrical contact with a capacitor top plate polysilicon portion defined by etched layer 1062) in the same way that capacitor top plate 8026 in FIG. 8D is formed, and also forms a top side contact 1090 in electrical contact with a region of substrate 1050 establishing a capacitor bottom plate. This substrate region could, for example, be the whole substrate for an implementation that has no series resistor or a highly doped region like heavily doped top surface region 9014 for a structure such as shown in FIG. 9B. (For a structure with a series resistor configuration such as shown in FIG. 6, the top side contact 1090 could be used to establish electrical contact with a region like highly doped lower region 6006 near the bottom side of the substrate. In such case, a high energy implantation could be done to increase the doping concentration in a vertical channel to provide a sinker region with same doping as the highly doped lower region extending from the top of the substrate at contact opening 1072 down to the region 6006. The top side contact 1090 could alternatively be used to provide electrical connection to the highly doped upper region 6004, with a bottom side contact or laterally displaced second top side contact serving to provide electrical contract to the lower region 6006.) The addition of the described steps to form a contact like top side contact 1090 in a capacitor formation process such as, for example, shown in FIGS. 8A-8D would add only one masking step.

Figure 11A:
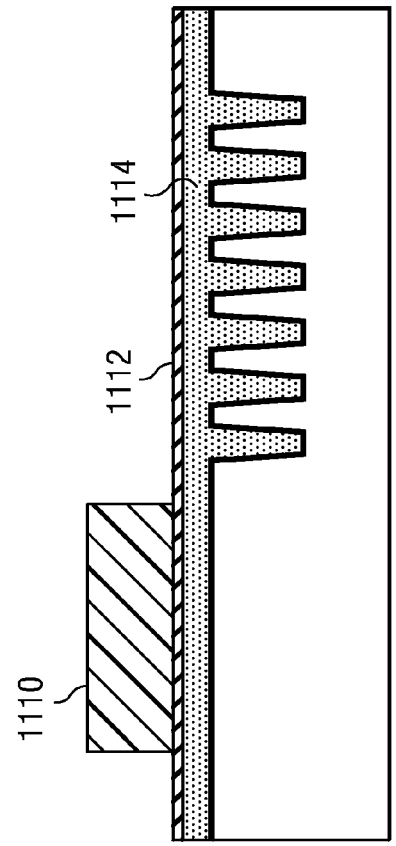
FIGS. 11A-11C are views illustrating steps that can be integrated in the fabrication of a capacitor for including a series resistor such as shown in FIG. 7.
Figure 11B:
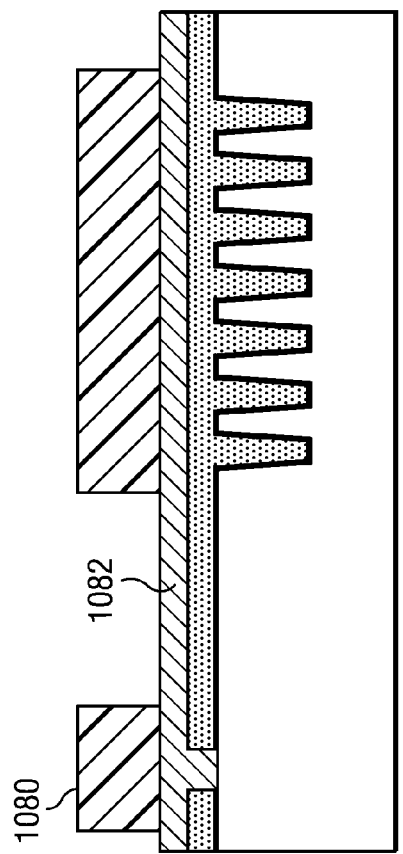
Figure 11C:
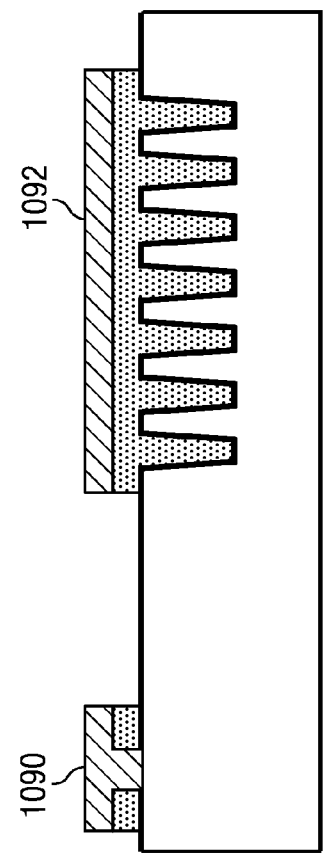

Example processing steps to form a lateral series resistor (e.g., with a configuration as shown in FIG. 7) instead of, or in addition to, the vertical series resistor of FIG. 6 is illustrated in FIGS. 11A-11C. Although the lateral series resistor can be formed without, or independently of, any contact formation, the same steps can be readily integrated with the steps for contact formation described with reference to FIGS. 10A-10E.

After removing the patterned mask layer 1070 following formation of the contact opening 1072 shown in FIG. 10A, for example, a hardmask layer may be deposited over the polysilicon layer 1062. This is shown for the independent case in FIG. 11A, wherein a hardmask layer 1112 is shown blanket deposited over polysilicon layer 1114 which is formed over a conformal dielectric layer within the trenches and extending laterally to the left beyond the trenched area. A layer of masking material 1110 (e.g., photoresist) is then formed over the hardmask layer 1112 and patterned to define the lateral dimensions for a resistive portion of the polysilicon layer 1114 to be used in formation of the lateral resistor. The hardmask layer is then etched using the template of the patterned layer 1112, resulting in formation of the patterned hardmask segment 1126 with dimensions defined by the transferred pattern. The polysilicon layer 1114 can be pre-doped (or doped in situ during deposition) to provide the required concentrations for the trenched and resistive portions. Another option is to uniformly dope the entire polysilicon layer 1114 (1062 in FIG. 10C) with the lower concentration for the resistive portion in situ during deposition, then add additional doping to the trenched (and contact) portions of layer 1114 using the patterned hardmask layer 1112 (alone or with the patterned mask layer 1110 still in place) as an implantation mask prior to formation of the next (viz., metal capping) layer. The material of hardmask 1112 is selected based on, e.g., etch selectivity and may be, e.g., a dielectric material such as an oxide or nitride.

After etching the hardmask layer 1112 to provide the hardmask segment 1126 (and after adding the additional doping, if any, to the portions of polysilicon layer 1124 not covered by the hardmask segment 1126 and removing any remaining part of the patterned mask layer 1110), a metal cap layer 1122 (1082 in FIG. 10D) is blanket deposited over the hardmask segment 1126 and polysilicon layer 1114/1124, as shown in FIG. 11B. Another mask layer is then formed over the metal cap layer 1122 and patterned portions 1120 defining a top side contact pattern and portions 1128 defining a top capacitor plate pattern as shown in FIG. 11B (portions 1080 and 1082 in FIG. 10D).

FIG. 11C shows the structure of FIG. 11B after etching the metal cap layer 1122 through the mask pattern 1120/1128 (1080/1082 in FIG. 10D) to form a contact 1132 (1090 in FIG. 10E) and a capacitor top plate contact 1134 (1092 in FIG. 10E). The hardmask segment 1126 (1130 in FIG. 11C) enables a complete etch of the metal cap layer 1122 from over the hardmask segment covered portion of the polysilicon layer 1124, without etching any of the underlying polysilicon layer 1124. The contact 1132 shown in FIG. 11C provides electrical connection to the top plate formed by the higher doped trench portion 1124 of polysilicon layer 1114 through a lateral series resistor established by the lower doped, high resistivity portion located beneath the hardmask segment 1126. Providing low resistance metal over the capacitor top plate (trenched) portion of the polysilicon layer 1122 helps ensure a uniform voltage application across the capacitor top plate. FIG. 11C further shows a backside metal layer 1136 deposited on the bottom surface of the substrate to form a low resistance contact to the capacitor bottom plate.

It will be appreciated that the described different configurations of the capacitors are not mutual exclusive, and that capacitors having different combinations of the described characteristics may be formed on a single semiconductor substrate. It will also be appreciated that vertical and/or series resistors and contacts as described can be added or omitted as considered appropriate for the particular implementation requirement or preference.

Those skilled in the art will appreciate that many other embodiments and variations are also possible within the scope of the claimed invention.

What is claimed is:

1. A method for forming a semiconductor device including a capacitor, comprising:
    forming a trench pattern mask over a top of a semiconductor substrate including a doped region of given conductivity type;
    etching the substrate through the trench pattern mask to form trenches in an area in the top of the substrate in the doped region;
    forming a dielectric layer conformally over the top of the substrate including following the contour within the trenches;
    forming a polysilicon layer over the dielectric layer to overfill the trenches;
    forming a top metal layer over the polysilicon layer;
    forming a top plate pattern mask over the top metal layer; and
    etching the polysilicon and top metal layers through the top plate pattern mask to define a capacitor top plate, a capacitor bottom plate being defined by the trenched doped region of the semiconductor substrate;
    wherein the doped region of given conductivity type comprises an upper region of the given conductivity type; and wherein the substrate further includes central and lower regions of the given conductivity type; the central region being located between the upper and lower regions, and having a doping concentration that is less than doping concentrations of the upper and lower regions.

2. The method of claim 1, wherein the upper region has a thickness that is less than a depth of the trenches, and generally follows the contour of the trenches.

3. The method of claim 1, further comprising forming a bottom metal layer over a bottom of the substrate in contact with the lower doping region.

4. A method for forming a semiconductor device including a capacitor, comprising:
    forming a trench pattern mask over a top of a semiconductor substrate including a doped region of given conductivity type;
    etching the substrate through the trench pattern mask to form trenches in an area in the top of the substrate in the doped region;
    forming a dielectric layer conformally over the top of the substrate including following the contour within the trenches;
    forming a polysilicon layer over the dielectric layer to overfill the trenches;
    forming a top metal layer over the polysilicon layer;
    forming a top plate pattern mask over the top metal layer; and
    etching the polysilicon and top metal layers through the top plate pattern mask to define a capacitor top plate, a capacitor bottom plate being defined by the trenched doped region of the semiconductor substrate;
    wherein the dielectric and polysilicon layers are formed with portions extending laterally beyond the trenched area; the method further comprises forming a hardmask layer over the polysilicon layer, forming a hardmask pattern mask over the hardmask layer, and etching the hardmask layer through the hardmask pattern mask to form a hardmask segment laterally separated from the trenched area; the top metal layer is formed over the polysilicon layer including over the hardmask segment; the top plate pattern mask includes a contact pattern; and the etching the polysilicon and top metal layers through the top plate pattern etches the top metal layer down to the hardmask layer and defines a top side contact separated from the capacitor top plate by a laterally extending resistor-defining portion of the polysilicon layer.

5. The method of claim 4, further comprising doping the polysilicon layer to provide top side contact, resistor and capacitor top plate regions, with the resistor regions having a lesser doping concentration than the top side contact and capacitor top plate regions.

* * * * *